(12) United States Patent
Hartman et al.

(10) Patent No.: US 6,236,206 B1
(45) Date of Patent: May 22, 2001

(54) GLOBALLY TUNABLE BIRDCAGE COIL AND METHOD FOR USING SAME

(75) Inventors: Spencer C. Hartman, Millbrae; Wai Ha Wong, San Jose, both of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/298,619

(22) Filed: Apr. 23, 1999

(51) Int. Cl.$^7$ .................................................. G01V 3/00
(52) U.S. Cl. ..................... 324/318; 324/322; 324/300
(58) Field of Search ................................ 324/318, 322, 324/300

(56) References Cited

U.S. PATENT DOCUMENTS

| | | | |
|---|---|---|---|
| 4,694,255 | 9/1987 | Hayes | 324/318 |
| 4,939,465 | 7/1990 | Biehl et al. | 324/318 |
| 4,992,737 | 2/1991 | Schnur | 324/318 |
| 5,144,240 | 9/1992 | Mehdizadeh et al. | 324/318 |
| 5,466,480 | 11/1995 | Zhou et al. | 427/63 |
| 6,011,395 | * 1/2000 | Leifer et al. | 324/318 |

OTHER PUBLICATIONS

Su et al, Journal of Magnetic Resonance Series B 110, 210–212 (1996).*

Article by Dardzinski et al., entitled "A Birdcage Coil Tuned by RF Shielding for Application at 9.4T", published in *Journal of Magnetic Resonance* on Mar. 1, 1998, vol. 131, pp. 32–38.

Article by Pimmel et al., entitled "A Hybrid Bird Cage Resonator for Sodium Observation at 4.7T", published in *Magnetic Resonance in Medicine* on Mar. 1, 1992, vol. 24, No. 1, pp. 158–162.

Article by Jeong et al., entitled "A Simple Inductive Tuning of Birdcage Coil, with Wide Range of Tuning", *Proceedings of the International Society for Magnetic Resonance in Medicine*, Fifth Scientific Meeting and Exhibition, Vancouver, B.C., Canada, Apr. 12–18, 1997, vol. 3, p. 1499.

Article by Pimmel et al., entitled "Hybrid Bird Cage Resonator," *Proceedings International Society for Magnetic Resonance in Medicine* in 1997, p. 527.

* cited by examiner

*Primary Examiner*—Christine Oda
*Assistant Examiner*—Brij B. Shrivastav
(74) *Attorney, Agent, or Firm*—Edward H. Berkowitz

(57) ABSTRACT

A birdcage coil is globally tuned by a tuning structure to maintain constant RF phase shift for each leg conductor of the birdcage while containing a load. The birdcage coil may be globally tuned by adjusting the capacitances or inductances in a symmetrical manner.

22 Claims, 6 Drawing Sheets

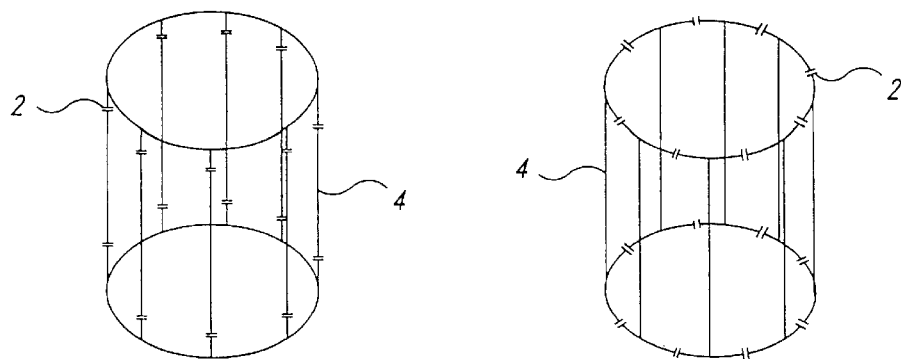
Fig. 1A (PRIOR ART)    Fig. 1B (PRIOR ART)
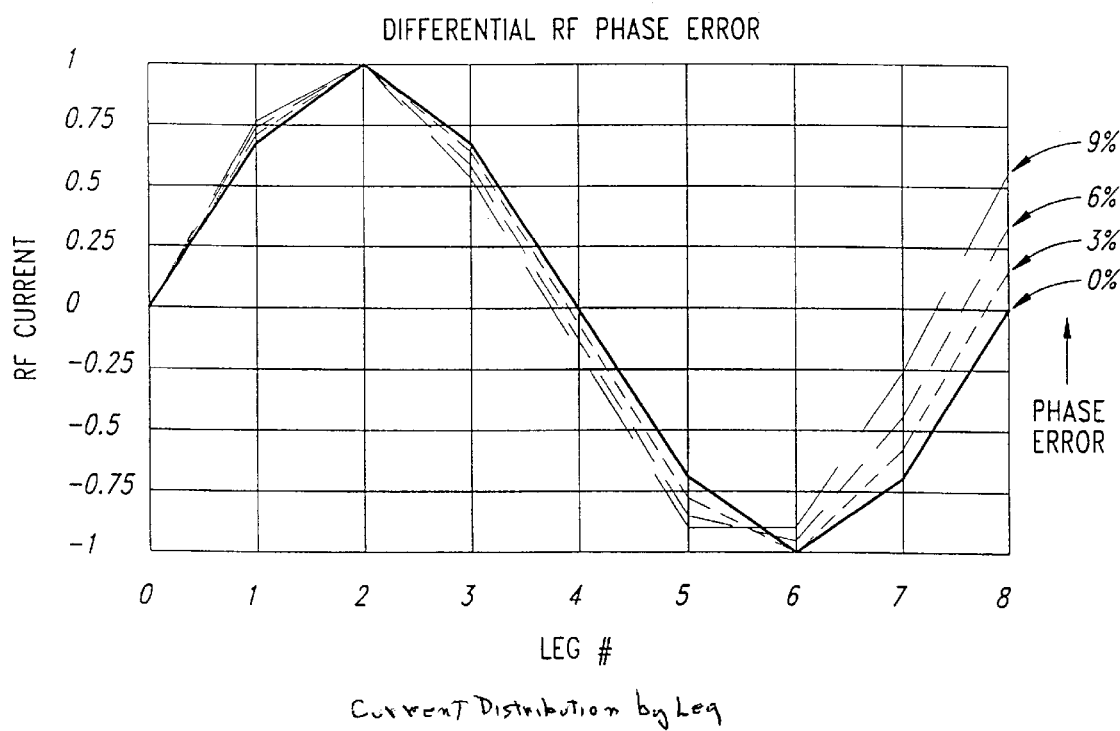
Current Distribution by Leg
Fig. 2A (PRIOR ART)

Bmag
0% RF PHASE ERROR

Bmag
3% RF PHASE ERROR

Bmag
6% RF PHASE ERROR

Bmag
9% RF PHASE ERROR

GLOBALLY TUNABLE BIRDCAGE COIL AND METHOD FOR USING SAME

FIELD OF THE INVENTION

This invention relates in general to nuclear magnetic resonance ("NMR") RF coils of a bird cage design, and more particularly, to a NMR birdcage coil being globally tunable by a movable structure.

BACKGROUND OF THE INVENTION

With contemporary technology, medical and/or chemical samples can be analyzed by a wide variety of methods. However, if an analysis of diverse chemical constituents and/or spatial distributions of such constituents are desired of a sample, the method most widely used is the practice of magnetic resonance.

In the practice of magnetic resonance phenomena, RF radiation is applied to a sample by a surrounding structure and resulting resonant signals are induced in the same or another surrounding structure for analysis. The structure may be a helical coil, saddle coil, resonant cavity, or a birdcage resonator. The latter structure is the object of the present work, wherein it is desired to obtain selected resonant frequencies in a birdcage type structure to facilitate studies of large or small samples.

In general, birdcage coils are constructed to act as either a low pass or a high pass structure. As illustrated in FIG. 1A, a conventional low pass birdcage coil provides at least one capacitive element 2 electrically coupled along each conductive leg 4. In contrast, a conventional high pass birdcage coil provides a capacitive element 2 electrically coupled between each conductive leg 4 as illustrated in FIG. 1B. With both structures, the conductive legs are typically supported by, or deposited upon a non-conductive material.

Functionally, the bird cage structure may be regarded as a periodic structure which closes on itself. Periodic elements of the structure produce phase shifts which must aggregate to some integer multiple of $2\pi$ when summed over the closed loop.

Geometrically, the resonator has cylindrical symmetry and it is desired that the RF current in each leg be proportional to $\sin k\theta/2\pi$ and/or $\cos k\theta/2\pi$, where $\theta$ is the azimuthal angle about the cylindrical axis and k is an integer defining resonant mode. The mode k=1 provides a uniform RF field distribution within the coil structure. Quadrature operation of the coil is realized when two RF drives of with relative phases of $\pi/2$ are connected to the coil at two points displaced in phase by $\pi/2$ about the phase distribution along the periphery of the coil.

The birdcage coil is tuned as closely as possible to the desired frequency by adjusting the capacitive elements (2 in FIG. 1) equally. In current designs, the final tuning adjustment is achieved by the discrete tuning of a single capacitor within the birdcage structure. However, by adjusting only a single capacitor, the user will only be able to obtain the desired frequency without maintaining the electrical symmetry of the structure. Therefore, optimum RF distribution will not be achieved within the structure.

Even if the birdcage coil can be adjusted with all capacitive elements 2 equal in the absence of a sample or load, insertion of a sample or load will require tuning the structure yet again to compensate for a decrease in frequency caused by the inherent dielectric properties of a typical load or sample. As illustrated in FIG. 2A, a change in frequency due to introduction of a load results in a phase error which must be compensated by the single tuning capacitor to restore the correct total phase shift of $\pi/2$. The result of phase error is an inhomogeneous B1 field as appears in the corresponding FIGS. 2B through 2D. It is sometimes useful to be able to tune a birdcage structure for observation of different nuclear species, e.g., $^1H$ and $^{19}F$. A tuning adjustment between such resonant frequencies could not be accomplished with variation of a single capacitance without completely destroying the uniformity of the RF field.

It would be advantageous to develop a birdcage structure which maintains the symmetry of the azimuthal distribution of phase shift around the structure as it is tuned to accommodate different loads or to observe different nuclear species. The desired structure provides a homogeneous field under all tuning conditions and preserves the symmetry necessary for quadrature operation.

SUMMARY OF THE INVENTION

In the present invention, a globally tunable birdcage coil is provided having a plurality of leg conductors disposed spatially from an axis and parallel therewith. The plurality of leg conductors define an active volume for receiving a load. The tuning structure maintains RF quadrature isolation within the active volume while the load is analyzed.

In a first embodiment, a tuning arrangement is provided for controlling magnetic field homogeneity within a birdcage coil over varying loading and coupling conditions. The birdcage coil includes a plurality of leg conductors disposed spatially from an axis and parallel therewith. A tuner structure is positioned adjacent the leg conductors and disposed about the axis for simultaneously tuning each of the leg conductors by varying the distance between ring conductors, each said ring conductor spaced from, and surrounding the respective end rings of a centrally disposed birdcage coil.

In another embodiment, a pair of coaxial birdcage coils is arranged with provision for the relative rotation of said coils.

BRIEF DESCRIPTION OF THE DRAWINGS

Other aspects and advantages of the invention will become apparent upon reading the following detailed description and upon reference to the drawings.

FIGS. 1A and 1B show a conventional circuit structure for a high pass and low pass birdcage coil, respectively.

FIG. 2A shows a graphical representation of the RF current per leg, and how the introduction of a load in a conventional birdcage can create a phase error or offset.

Figure 2B:
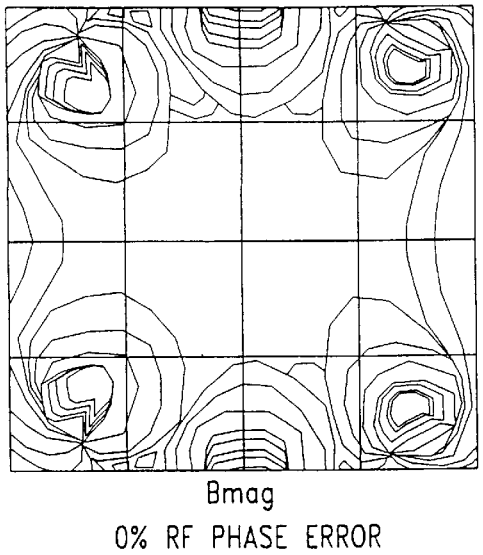
FIGS. 2B–2E show the magnitude of the B1 field in accordance with each respective phase error as shown in FIG. 1.
Figure 2C:
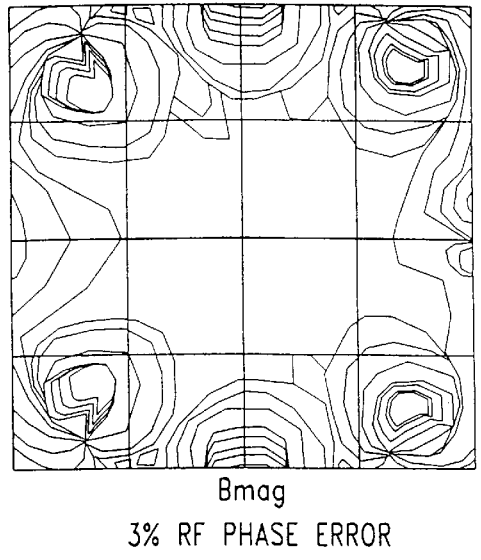
Figure 2D:
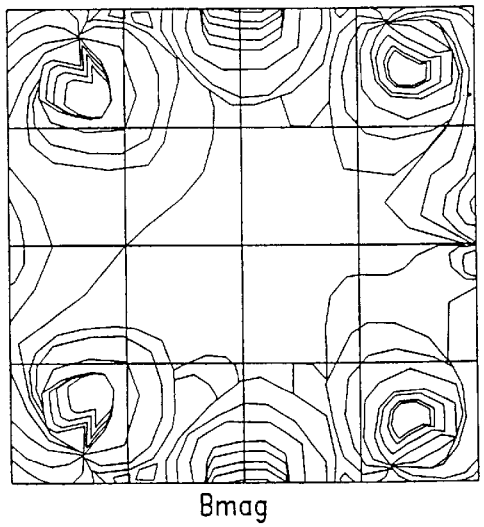
Figure 2E:
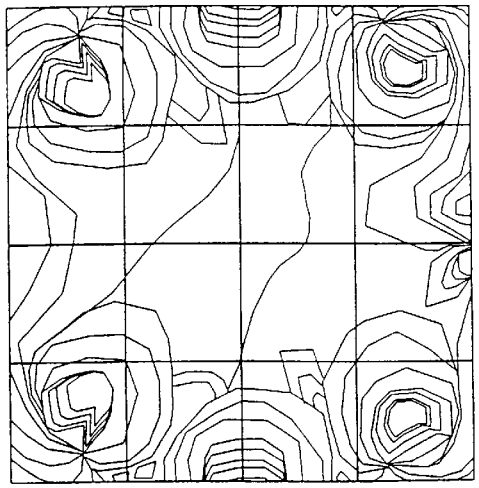

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

In general, the physical context of the invention is a birdcage coil apparatus for nuclear magnetic resonance ("NMR") or magnetic resonance imaging ("MRI"). An idealized RF resonant structure for a birdcage coil is included in the system shown in FIG. 3. This structure can obtain a homogeneous RF field in which to immerse an object or sample for study.

Figure 3:
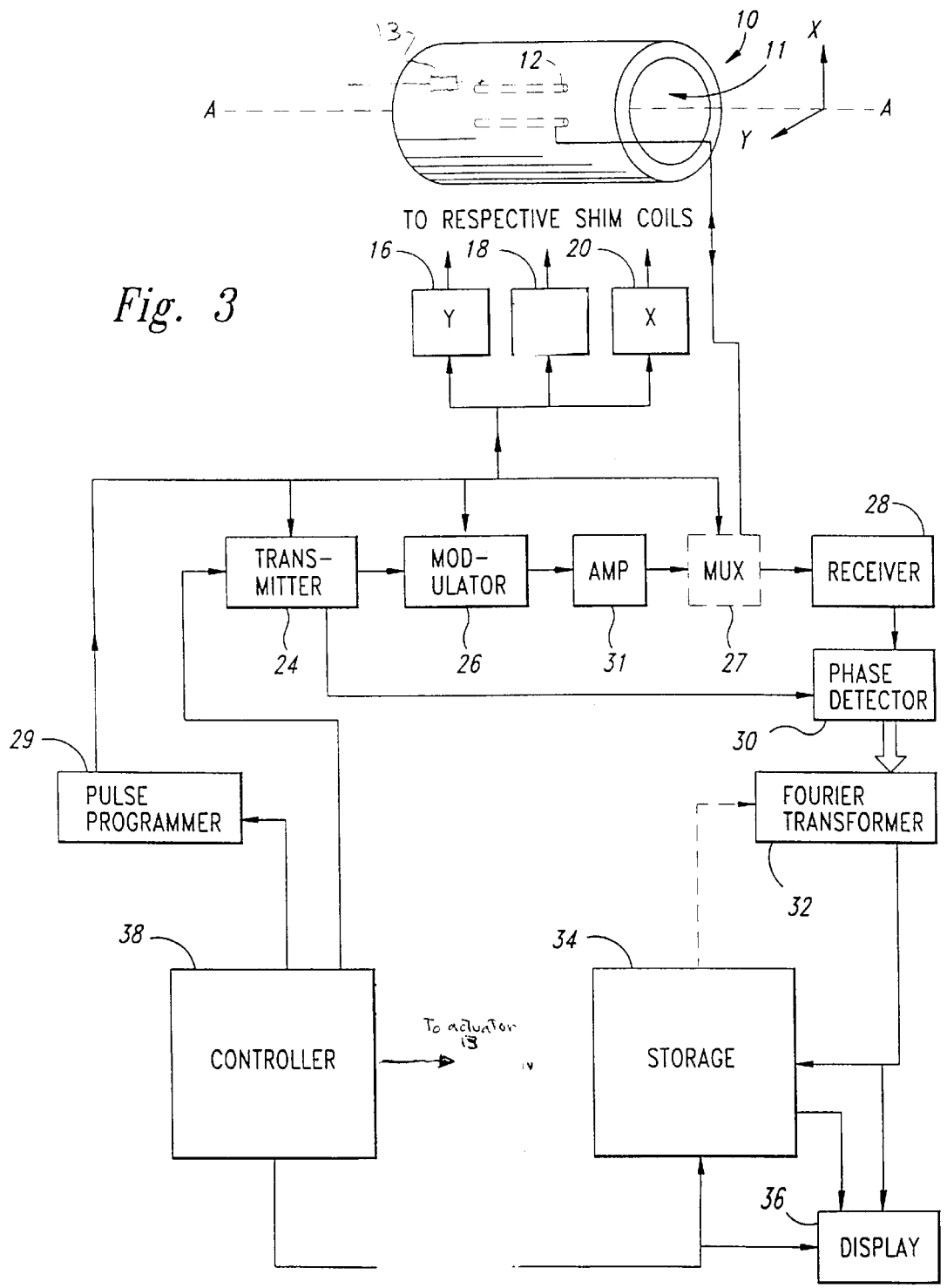
FIG. 3 is a schematic illustration of a NMR apparatus for the context of the invention.
Figure 5A:
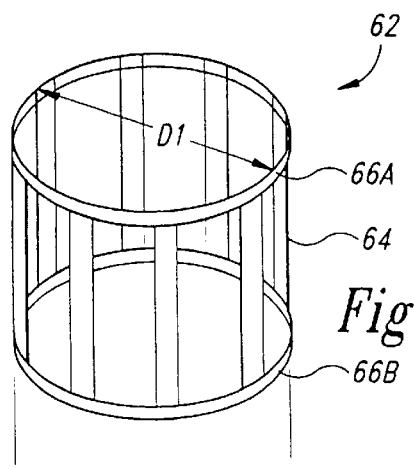
FIGS. 5A–5C illustrates an exploded view of the globally tunable birdcage of FIG. 4.

The context for the invention is shown in FIG. 3. A magnet 10 having bore 11 provides a main magnetic field. In order to control the magnetic field with precision in time and direction, there are provided magnetic field gradient coils (not shown). The gradient coils are driven by gradient power supplies 16, 18 and 20, respectively. Additionally, other shimming coils and power supplies (neither shown) may be required for compensating residual undesired spatial inhomogeneities in the basic magnetic field. An object, or fluid for analysis (hereafter "sample") is placed within the magnetic field in bore 11. The sample is subject to irradiation by RF power, such that the RF magnetic field is aligned in a desired (orthogonal) relationship with the magnetic field in the interior or active volume of bore 11. This is accomplished through a transmitter coil 12 in the interior of bore 11 where resonant signals are induced in a sample. A receiver coil is disposed proximate (and typically surrounding) the sample within bore 11. The transmitter and receiver coils may be the identical structure, or separate structures.

As shown in FIG. 3, RF power is provided from transmitter 24 and is amplified by amplifier 31 and then directed via multiplexer 27 to the RF transmitter coil 12 located within bore 11. Transmitter 24 may be modulated in amplitude, frequency, phase, or a combination thereof, either upon generation or by modulator 26. The identical coil 12 may be employed to derive signals from the sample. Thus, a multiplexer 27 is provided to isolate the receiver from the transmitter.

The modulator 26 is controlled by pulse programmer 29 to provide RF pulses of desired amplitude, duration and phase relative to the RF carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance wave form is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter ("ADC") structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved wave forms to enhance the signal-to-noise ratio. The transformation function is then applied to the resultant averaged wave form. Display device 36 operates on the acquired data to present the same for inspection. Controller 38, most often comprising one or more computers, controls and correlates the operation of the entire apparatus.

During operation, the birdcage coil is effectively described as a ladder circuit or transmission line which closes on itself wherein the current flow around the circuit is distributed sinusoidally among the axially extending legs of the birdcage structure. Consequently, the birdcage structure is often regarded as a periodic structure over which the RF phase shift (which must aggregate to $2\pi k$) is distributed as illustrated in FIG. 2A. The birdcage resonator is most commonly realized in cylindrical geometry and is most commonly operated in the k=1 mode which produces a maximally uniform transverse field within the sample volume, but the present invention applies equally to operation in higher order modes.

Birdcage coils operating in the k=1 mode require that the RF phase varies around the circumference of the coil over the range of 0 to $2\pi$. To realize the greatest uniformity in the RF field, the phase shift per leg should be $2\pi/N$ where N is the number of legs. If tuning is accomplished by varying the capacitance of one leg only, phase shift equality will not be maintained and RF homogeneity will be degraded.

The following disclosure will provide various embodiments that allows a user to tune an MRI or NMR birdcage coil in a way which keeps the RF field homogenous under different loading, capacitive and inductive coupling conditions. In general, this will be accomplished by tuning each leg and each capacitor of the birdcage coil in an identical or global manner. This allows the RF phase shift per leg, $\Delta\phi$ to be kept constant which is the critical parameter in keeping the RF homogeneity optimized. In other words, the RF phase per leg/mesh must be kept equal to $2\pi/N$, where N is the number of legs. This will allow an operating birdcage coil having a load to remove any offset on each leg of the birdcage and behave optimally with a contained load at 0% RF phase error as illustrated in FIGS. 2A. The equation for RF phase per leg/mesh, $$\Delta\phi \alpha F(C,L),$$

is a complex function of the leg/mesh inductance, L, and Capacitance, C.

Illustrative embodiments of the invention are described below. In the interest of clarity, not all features of an actual implementation are described in this specification. It will of course be appreciated that in the development of any such actual embodiment, numerous implementation-specific decisions must be made to achieve specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIGS. 4 and 5A–5C, a perspective view of a first embodiment is shown for a globally tunable birdcage 40 in accordance with the present invention. This embodiment can be used for a high pass or low pass birdcage structure. Consequently, the respective illustrations for birdcage coil 42 do not specifically show a high or low pass structure.

Figure 5B:
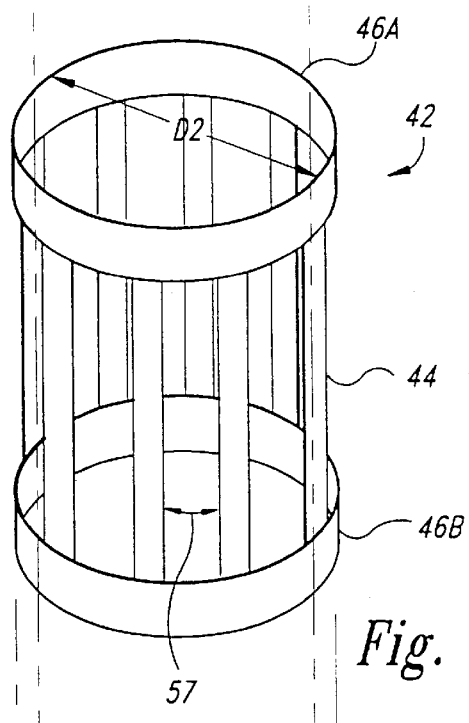

As illustrated in Figure 5B, a conventional birdcage coil 42 is shown having eight legs 44 connected between top and bottom bands 46A and 46B by a know method. The schematic operational structure of FIG. 3 powers and controls birdcage coil 42.

Legs 44 are made from a conductive material such as copper, aluminum, silver or gold, and bands 66A and 66B are made from a non-conductive material such as PTFE circuit board or Kapton. The skilled artisan will appreciate that the diameter D2 of birdcage coil 42, and the number of legs 44 may be selected to accommodate the desired load and operational characteristics.

Figure 5C:
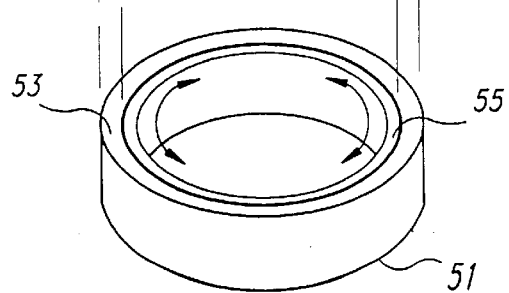

Birdcage coil 42 connects to a turntable structure 51 having an outer and an inner ring platform 53 and 55, respectively, as illustrated in Figure 5C. In this particular embodiment, outer platform 53 is stationary and provides a means (not shown) for rotating inner platform 55. Outer platform 53 connects to a power source (not shown) and rotates inner ring platform 55 after receiving control signals from controller 38 of FIG. 3. Typically, outer platform 53 will only have to rotate a fraction of circumferential distance 57 away from or towards adjacent leg 44 to tune operational birdcage coil 42.

Coaxial tuner 62 couples to inner platform 55 of turntable platform 51. Similar to birdcage 42, tuner 62 provides non-conductive bands 66A and 66B attached at either end of conductive legs 64 to define an active volume. Conductive legs 64 may be made from materials selected from the group including cooper, aluminum, silver and gold. In turn, non-conductive bands 66A and 66B may be made from a material such as a PTFE circuit board material or Kapton.

In particular, tuner 62 includes eight tuning legs 64 connected between top and bottom tuner bands 66A and 66B. Bands 66A and 66B define a diameter $D_1$ that defines a cylindrical volume. The skilled artisan will recognize that the diameter or the axial length of tuner 62 may be selected to provide a structure which is internal or external to the volume of birdcage coil 42. In addition, the number of tuner legs 64 may change to accommodate the desired birdcage coil structure in height and diameter. In a preferred embodiment, birdcage coil 42 provides an axial diameter ($D_2$) of 6.25 inches and tuner 62 provides a diameter ($D_1$) of 6 inches.

Figure 4:
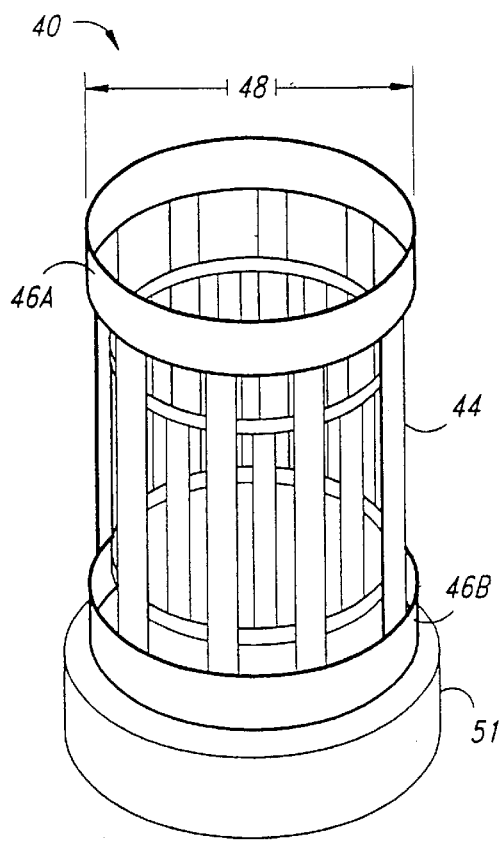
FIG. 4 illustrates an isometric view of a globally tunable birdcage in accordance with one embodiment of the present invention.

When tuner 62 is mounted onto turntable platform 51 and within coil 42 as illustrated in FIG. 4, each leg 64 of tuner 62 resides adjacent to a pair of birdcage legs 44. By mounting each tuner leg 64 between or adjacent to each birdcage leg 44, a slight axial rotation of tuner 61 in direction 57, relative to a stationary birdcage 42, will globally adjust the inductance of an operational birdcage coil 42. This rotation will maintain a homogeneous RF field therein. In other words, when a load is positioned within operational birdcage coil 42, turntable 51 will rotate tuner 62 as far as necessary to maintain a 0% phase error and homogeneous RF field as illustrated in FIGS. 2A and 2B.

The rotation of turntable 51 is indirectly controlled by the schematic structure of FIG. 3. In particular, controller 38 monitors the RF resonant frequency of birdcage 42 during operation using conventional sensors and software. A variety of monitoring techniques are known and practiced for deriving a signal from an RF probe indicative of the difference between actual and desired RF performance parameters, individually or in combination, viz. Amplitude, frequency, phase. If the frequency varies, controller 38 sends a correction signal that defines the angle through which turntable 51 should rotate within birdcage coil 42 to reduce the error. By rotating turntable 51, tuner legs 66 change the inductive value of the birdcage to maintain a constant RF phase shift per leg therein.

The skilled artisan will recognize that a dielectric load or biological sample inserted into a birdcage coil 42 reduces the resonant frequency of the birdcage. With the inventive structure, as each leg 64 of tuner 62 increasingly overlaps a respective leg 44 of birdcage coil 42, the capacitance will increase and the inductance will decrease. This process can create a (typical) one to three percent change in frequency or a two to six percent change in phase error to maintain RF phase shift per leg for the loaded active birdcage coil.

The specific details of how inner platform 55 rotates is not included herewith since it is within the skill of the practioner to employ an appropriate mechanical arrangement. Therefore, various conventional structures can be used to rotate tuner 62 around a contained sample depending on the characteristic needs for turntable platform 51.

The skilled artisan will appreciate that outer ring platform 53 could be movable if it was desirable to have the inner ring 55 stationary, or both rings 53 and 55 movable. Additionally, persons of ordinary skill in the relevant arts will appreciate that the inner and outer diameter of platform 51 may be selected to accommodate a tuner that either surrounds or is encapsulated by birdcage coil 42. In turn, platform 51 may not have an inside diameter so that a sample could rest on the created central platform surface (not shown) for analysis. The tuning member may be either the inner or outer structure, as appropriate.

Figure 7A:
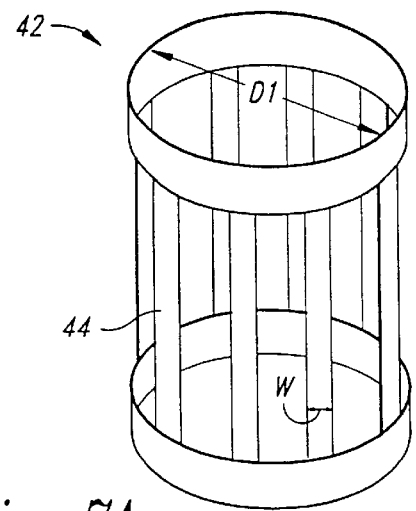
FIGS. 7A–7C illustrates an exploded view of the globally tunable birdcage of FIG. 6.
Figure 6:
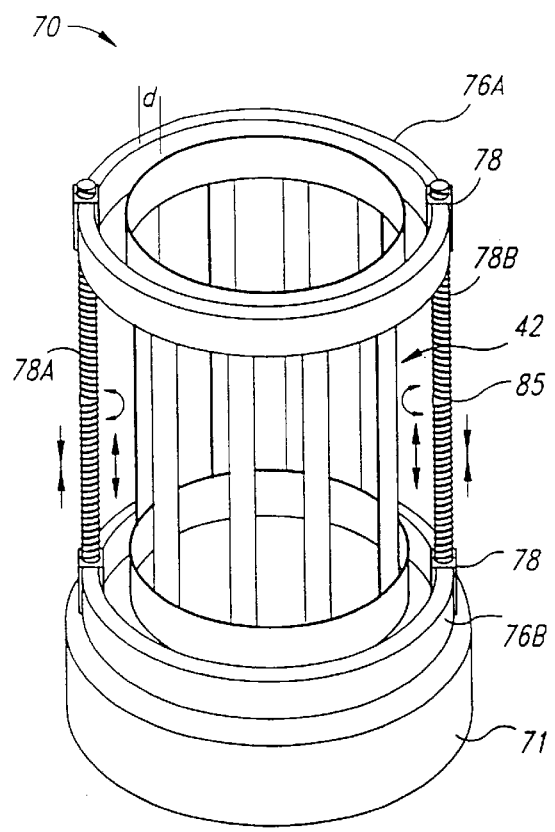
FIG. 6 illustrates an isometric view of a globally tunable birdcage in accordance with another embodiment of the present invention.
Figure 7B:
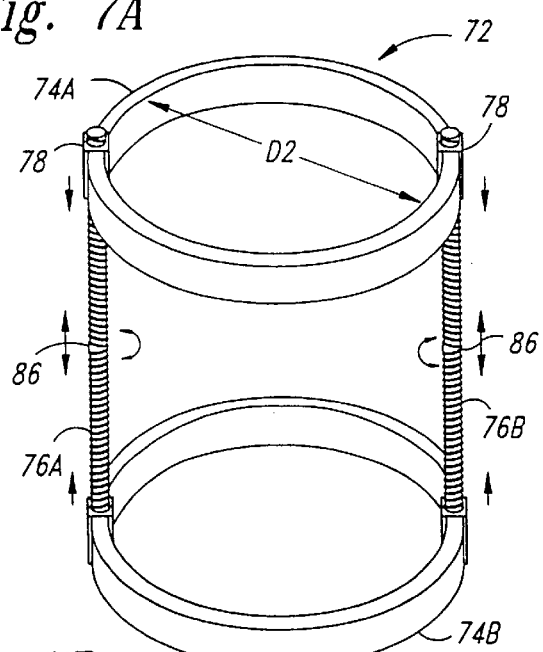
Figure 7C:
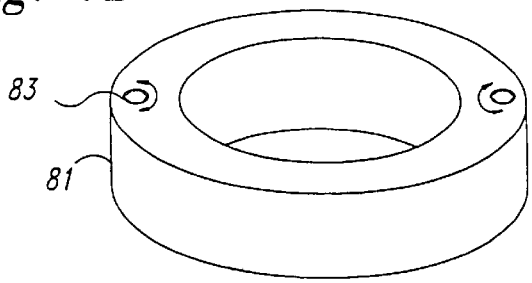

Turning now to FIGS. 6 and 7A–7C, another embodiment of the present invention is shown. In particular, FIG. 6 illustrates another globally tunable birdcage structure 70, and FIGS. 7A–7C illustrate an exploded view of the same. As illustrated in FIG. 7A, birdcage coil 42 provides a similar conventional structure as that illustrated in FIG. 5B. However, for this embodiment, the birdcage coil will preferably provide a low pass structure.

Generally, FIG. 7B illustrates a capacitive tuner 72 having movable end rings 74A and 74B that function as variable capacitors when a load is introduced into birdcage coil 42. Rings 74A and 74B are made from a conductive material such as copper, aluminum, silver, or gold. In the preferred embodiment, tuner 72 surrounds birdcage coil 42 with rings 74A and 74B connected to oppositely opposed non-conductive posts 76A and 76B. Rings 74A and 74B connect to respective posts 76A and 76B by brackets 78.

As illustrated in FIGS. 7A–7C, posts 76A and 76B connect to platform 81 at rotating mounts 83. A motor or actuator 13 turns mounts 83 when necessary to globally tune birdcage structure 70. In particular, when mounts 83 turn, rings 74A and 74B will move away from or towards each other. This is possible because posts 76A and 76B provide a threaded structure that alternate directions at a central location 86, and brackets 78 use a complimentary thread structure to allow rings 74A and 74B to travel up or down posts 76A and 76B when they rotate. Consequently, each leg 44 of birdcage coil 42 is tuned with the same capacitance in a balanced fashion when a load is introduced into birdcage coil 42 for analysis by rotating posts 76A and 76B to move rings 74A and 74B away or towards each other, or central location 86.

Similar to the embodiment of FIG. 4, the schematic structure of FIG. 3 indirectly controls the rotation of posts 76A and 76B to tune operational birdcage 42. In particular, the schematic structure senses the resonant frequency of birdcage coil 42 and sends the necessary signal to platform 81 for tuning rings 74A and 74B.

With the above embodiment, the distance d between tuner rings 74A and 74B and birdcage coil legs 44 dictates the functional means for adjusting the magnetic field of an operational birdcage coil. This can be mathematically demonstrated by the defining relationship $$d = \frac{\varepsilon_0 A}{C}$$

where "d" is the gap between the tuner rings and the birdcage coil legs, $\varepsilon_0$ s the permittivity of free space, A is the surface area of a birdcage capacitor, and C is the preferred capacitance for each leg of a birdcage coil.

In terms of functionality, when the gap d is less than a percentage of the width w of a birdcage coil leg 44, tuner rings 74A and 74B alter the capacitive properties of the operational birdcage coil. By changing the capacitive properties, the frequency and RF magnetic field homogeneity of the operational birdcage coil will change to maintain the desired performance. More specifically, as the capacitance of the birdcage coil increases, the frequency will decrease.

On the other hand, if the distance d is greater than (of the order of) 0.01 of the width w of a birdcage coil leg 44, tuner rings 74A and 74B will adjust the magnetic field properties of the operational birdcage coil. In particular, as tuner rings 74A and 74B move to overlap the capacitors ends of birdcage legs 44, the frequency will increase.

In a preferred embodiment, distance d will be equal to about three percent of the width w of the respective birdcage coil leg 44. Consequently, if the capacitance C is 10 pf and the area A is about 0.5 cm$^2$, the distance d will be about 10 $\mu$m. A person of ordinary skill in the art will recognize that the distance d may vary depending on many variables, including the materials used for the globally tunable birdcage, structural dimensions of the birdcage coil, the load, the power applied, etc.

A Method for Practicing the Invention

Figure 8:
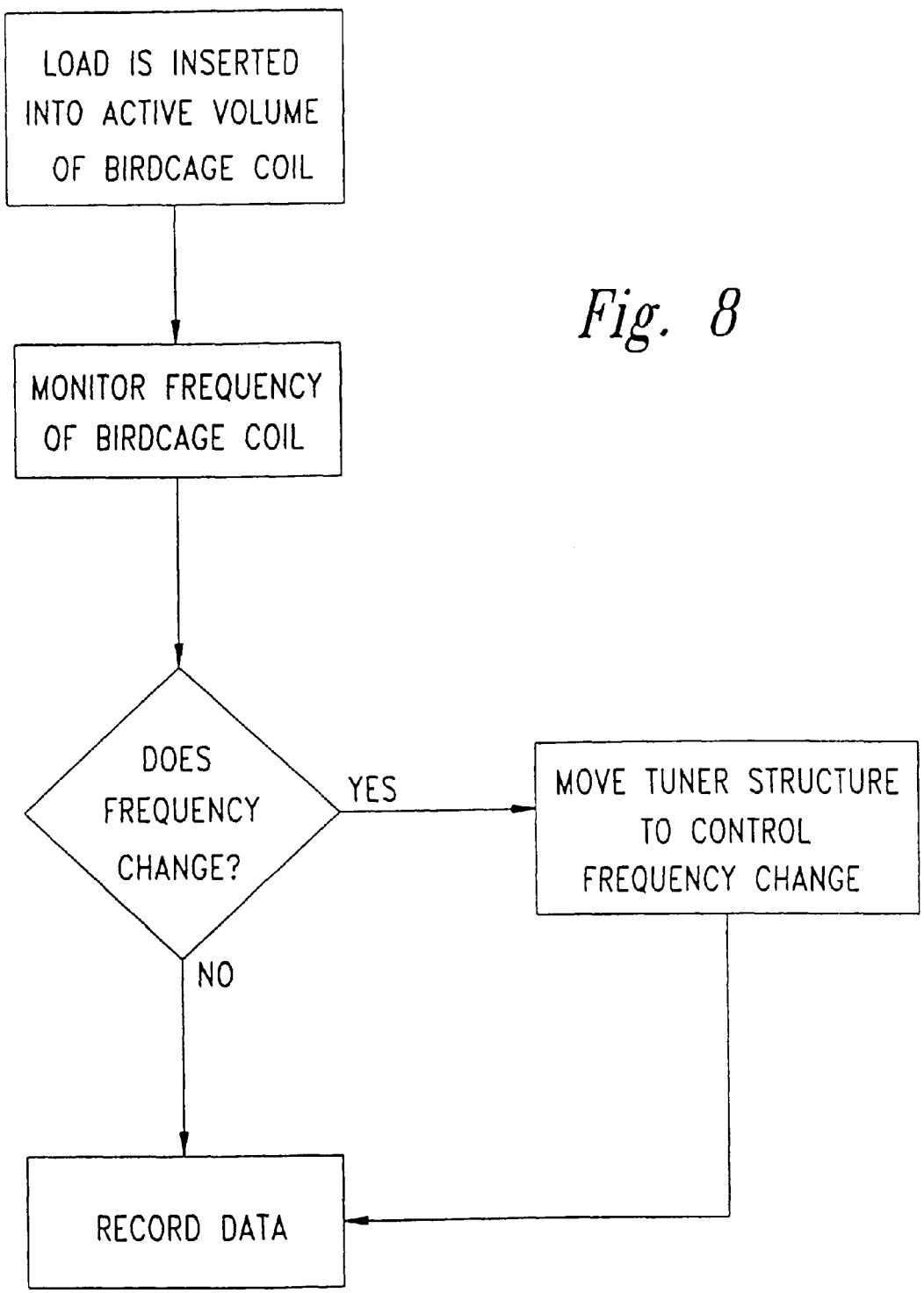
FIG. 8 illustrates a flow chart in accordance with the operation of the inventive birdcage of FIGS. 4 and 6.

Referring now to FIG. 8, a flow chart illustrates a method for implementing the embodiments described above for a globally tunable birdcage coil of the present invention. Initially, a sample or load is inserted into the active volume of the birdcage coil. This insertion process could be as simple as positioning the sample on the platform for moving the tuning structure, or by moving a liquid sample through the active volume of birdcage coil 46 via a tube that is centrally positioned within the birdcage coil active volume. Samples or loads could include elements such as a fluid specimen or some bodily portion of a human or animal.

With the sample positioned within the active volume of the birdcage coil 42, controller 38 (FIG. 3) will compare the frequency of the birdcage coil to a reference and develop a correction signal by a known method. The correction signal developed by controller 38 is directed to platform 51 or 81 of FIGS. 4 or 6, respectively. The signal initiates an actuator 13 or drive motor of the platform to reduce or minimize the error signal.

It will be appreciated by skilled artisans that a known conductive shield (not shown) can be mounted to surround the globally tunable birdcage structure 40 and 70. The shield would enhance the present inventive embodiments by removing the occurrence of parasitic currents on the outer conductor of the driving coaxial cable and the inherent interaction of the balanced coil with the coax outer conductor by capacitive and radiative coupling. U.S. Pat. No. 6,011,395 entitled "Shielded Drive For Balanced Quadrature Bird Cage Coil", commonly assigned herewith, is incorporated herein by reference as an example of typical shield structure for a birdcage coil.

With the globally tunable birdcage structure embodiments recited above, the RF current of a loaded conventional birdcage can be maintained to prevent an offset and provide a homogeneous RF field. With a homogeneous RF field, the RF phase shift per conductive leg can be maintained, and the best possible data can be derived from the load.

All changes, modifications, variations and other uses and applications which do not depart from the spirit and scope of the invention are deemed to be covered by the invention which is limited only by the claims.

What is claimed is:

1. A globally tunable birdcage coil, comprising:
    a plurality of leg conductors disposed spatially from an axis and parallel therewith, said plurality of leg conductors defining an active volume and each one of said leg conductors comprising a reactive impedance having a capacitive and an inductive coupling to the load; and
    a tuning structure for controlling such reactive impedance of said active volume in a constant selected relationship to each said other reactive impedance while analyzing the load, said tuning structure further comprising a top and a bottom movable conductive end ring respectively disposed to spatially surround a planar top and a bottom portion of said plurality of leg conductors.

2. The coil of claim 1, wherein said tuning structure simultaneously controls the capacitance to each one of said plurality of leg conductors.

3. The coil of claim 3, wherein said tuning structure further includes a tuner platform for simultaneously moving each one of said movable end rings away or towards each other along said axis.

4. The coil of claim 2, wherein said top and bottom end ring are spatially separated from said plurality of leg conductors by a distance, said distance being less than the lateral dimension of any one of said plurality of leg conductors.

5. The coil of claim 3, wherein said top and bottom end ring are spatially separated from said plurality of leg conductors by a distance, said distance selectable to allow the capacitance of said reactive impedance to be within a selected range.

6. The coil of claim 2, wherein said top and bottom end ring are spatially separated from said plurality of leg conductors by a distance, said distance being of the order of three percent of the lateral dimension of any one of said plurality of leg conductors.

7. The coil of claim 2, wherein said top and bottom end ring are spatially separated from said plurality of leg conductors by a distance, said distance selectable to allow the reactive impedance to be adjustable within a selected range by changing the magnetic field within said active volume.

8. The coil of claim 1, wherein said tuning structure further includes:
    at least two diametrically disposed posts extending the height of said birdcage coil and having bi-directional threading, said bi-directional threading to define a top and bottom portion of said posts and active volume; and
    conductive end rings spatially surrounding a top and bottom planar portion of said active volume and connect to said posts.

9. The coil of claim 8, wherein said tuning structure further includes a platform mounted to said posts for turning said posts to move said conductive end rings along said threads.

10. The coil of claim 1, wherein said active volume spatially surrounds a central portion of said tuning structure.

11. The coil of claim 1, wherein said tuning structure simultaneously controls an equal inductance to each one of said leg conductors.

12. The coil of claim 1, wherein said tuning structure further includes a plurality of tuning leg disposed spatially from said axis and parallel therewith.

13. The coil of claim 12, wherein said plurality of tuning legs are coaxially adjacent and positioned with respect to said plurality of leg conductors.

14. The coil of claim 12, wherein said tuning structure further includes a turntable platform for mounting and rotating said plurality of tuning legs adjacent to said plurality of conductor legs.

15. The coil of claim 1, further including a conducting shield surrounding the coil and extending axially beyond the coil by an amount sufficient to achieve satisfactory reduction of interaction of the coil to its near environment and to a connecting cable.

16. A method of controlling magnetic field homogeneity within a birdcage coil over varying loading and coupling conditions, said birdcage coil comprising a plurality of leg conductors disposed spatially from an axis and parallel therewith, said birdcage coil defining an interior volume thereof, the method comprising:

moving a tuning structure positioned adjacent said leg conductors and disposed about said axis to simultaneously tune each one of said leg conductors, while maintaining said volume constant.

17. The method of claim 16, wherein said step of moving further includes rotating said tuning structure along said axis between adjacent leg conductors.

18. The method of claim 16, wherein said tuning structure further comprising a top and a bottom movable conductive end ring respectively disposed to spatially surround a planar top and a bottom portion of said plurality of leg conductors and said step of moving further includes joining oppositely opposed conductive end rings that surround a top and bottom planar portion of said birdcage coil.

19. A globally tunable birdcage coil, comprising:

a birdcage coil having a plurality of leg conductors disposed spatially from an axis and parallel therewith, said plurality of leg conductors defining an active volume for receiving a load with a selected RF phase relationship between said conducting legs; and a tuning structure for maintaining said selected phase relationship when said active volume receives said load, said tuning structure further comprising at least one movable impedance element positioned adjacent said coil.

20. The coil of claim 19, wherein said impedance element further includes a rotatable inductive element.

21. The coil of claim 19, wherein said impedance element further includes two capacitive rings being positioned to spatially surround a planar top and bottom portion of said active volume.

22. An NMR apparatus for examination of a sample, comprising a polarizing magnet to define an axial field, a RF source to impose RF radiation on a sample in specified relationship to said polarizing magnet, a globally tuned birdcage coil for either collecting resonant RF signals from said sample or for supplying RF radiation to said sample, comprising a birdcage coil having a plurality of leg conductors disposed spatially from an axis and parallel therewith, said plurality of leg conductors defining an active volume for receiving a load with a selected RF phase relationship between said conducting legs; and a tuning structure for maintaining said selected phase relationship when said active volume receives said load said tuning structure further comprising a top and a bottom movable conductive end ring respectively disposed to spatially surround a planar top and a bottom portion of said plurality of leg conductors.

* * * * *